(12) United States Patent
Zhang et al.

(10) Patent No.: US 11,387,308 B2
(45) Date of Patent: Jul. 12, 2022

(54) ARRAY SUBSTRATE, DISPLAY APPARATUS, AND METHOD OF FABRICATING ARRAY SUBSTRATE

(71) Applicant: BOE TECHNOLOGY GROUP CO., LTD., Beijing (CN)

(72) Inventors: Feng Zhang, Beijing (CN); Zhijun Lv, Beijing (CN); Wenqu Liu, Beijing (CN); Liwen Dong, Beijing (CN); Shizheng Zhang, Beijing (CN); Ning Dang, Beijing (CN); Zhiyong Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 45 days.

(21) Appl. No.: 16/071,681

(22) PCT Filed: Dec. 11, 2017

(86) PCT No.: PCT/CN2017/115451
§ 371 (c)(1),
(2) Date: Jul. 20, 2018

(87) PCT Pub. No.: WO2019/006988
PCT Pub. Date: Jan. 10, 2019

(65) Prior Publication Data
US 2021/0202648 A1    Jul. 1, 2021

(30) Foreign Application Priority Data
Jul. 7, 2017    (CN) .......................... 201710549810.6

(51) Int. Cl.
*H01L 27/32*        (2006.01)
*H01L 29/786*       (2006.01)

(52) U.S. Cl.
CPC ...... *H01L 27/3276* (2013.01); *H01L 27/3246* (2013.01); *H01L 29/7869* (2013.01);
(Continued)

(58) Field of Classification Search
CPC ............. H01L 27/3276; H01L 27/3246; H01L 29/78675; H01L 2227/323; H01L 29/78678; H01L 29/7869
(Continued)

(56) References Cited

U.S. PATENT DOCUMENTS 6,140,668 A    10/2000 Mei et al.
2004/0253771 A1*  12/2004 Yamazaki ......... H01L 29/66765
                                                      438/149
(Continued)

FOREIGN PATENT DOCUMENTS

CN    103474430 A    12/2013
CN    104317089 A    1/2015
(Continued)

OTHER PUBLICATIONS

English Machine Translation of CN106356407 (Year: 2017).*
(Continued)

*Primary Examiner* — Dzung Tran
(74) *Attorney, Agent, or Firm* — Intellectual Valley Law, P.C.

(57) ABSTRACT

The present application discloses an array substrate having a plurality of first thin film transistors and a plurality of second thin film transistors. Each of the plurality of first thin film transistors includes a silicon active layer. The array substrate includes a base substrate; a silicon layer having a plurality of silicon active layers respectively for the plurality of first thin film transistors; and a UV absorption layer on a side of the silicon layer distal to the base substrate, and including a plurality of UV absorption blocks. Each of the
(Continued)

plurality of UV absorption blocks is on a side of the one of the plurality of silicon active layers distal to the base substrate, and is insulated from the one of the plurality of silicon active layers.

18 Claims, 7 Drawing Sheets

(52) U.S. Cl.
CPC .. *H01L 29/78675* (2013.01); *H01L 29/78678* (2013.01); *H01L 2227/323* (2013.01)
(58) Field of Classification Search
USPC .......................................................... 257/40
See application file for complete search history.

(56) References Cited

U.S. PATENT DOCUMENTS

| | | | | |
|---|---|---|---|---|
| 2005/0275038 | A1* | 12/2005 | Shih | H01L 29/78633 257/382 |
| 2009/0283762 | A1* | 11/2009 | Kimura | H01L 27/1225 257/43 |
| 2013/0015448 | A1* | 1/2013 | Yang | H01L 27/1251 257/59 |
| 2013/0193843 | A1* | 8/2013 | Yan | H01L 27/3267 313/504 |
| 2014/0048812 | A1* | 2/2014 | Nakano | G09G 3/3648 257/71 |
| 2014/0346465 | A1* | 11/2014 | Kim | H01L 51/0004 257/40 |
| 2016/0349580 | A1 | 12/2016 | Feng et al. | |
| 2016/0359054 | A1 | 12/2016 | Fang et al. | |
| 2017/0084636 | A1 | 3/2017 | Lin et al. | |
| 2018/0090521 | A1 | 3/2018 | Tian et al. | |
| 2018/0197897 | A1 | 7/2018 | Xin et al. | |

FOREIGN PATENT DOCUMENTS

| | | | |
|---|---|---|---|
| CN | 104600081 | A | 5/2015 |
| CN | 104900655 | A | 9/2015 |
| CN | 105097829 | A | 11/2015 |
| CN | 105470196 | A | 4/2016 |
| CN | 106024838 | A | 10/2016 |
| CN | 106356407 | A | 1/2017 |
| CN | 106558538 | A | 4/2017 |
| CN | 106876412 | A | 6/2017 |

OTHER PUBLICATIONS

International Search Report & Written Opinion dated Apr. 11, 2018 regarding PCT/CN2017/115451.
Second Office Action in the Chinese Patent Application No. 201710549810.6, dated Oct. 28, 2020; English translation attached.
First Office Action in the Chinese Patent Application No. 201710549810.6, dated Mar. 18, 2020; English translation attached.

* cited by examiner

ARRAY SUBSTRATE, DISPLAY APPARATUS, AND METHOD OF FABRICATING ARRAY SUBSTRATE

CROSS-REFERENCE TO RELATED APPLICATION

This application is a national stage application under 35 U.S.C. § 371 of International Application No. PCT/CN2017/115451, filed Dec. 11, 2017, which claims priority to Chinese Patent Application No. 201710549810.6, filed Jul. 7, 2017, the contents of which are incorporated by reference in the entirety.

TECHNICAL FIELD

The present invention relates to display technology, more particularly, to an array substrate, a display apparatus, and a method of fabricating an array substrate.

BACKGROUND

An array substrate typically includes a plurality of subpixels in its display area, each of the plurality of subpixels is controlled by a thin film transistor for image display. Various driving circuits of the array substrate are typically disposed in a peripheral area of the array substrate. These driving circuits also include thin film transistors necessary for their operation.

SUMMARY

In one aspect, the present invention provides an array substrate, having a plurality of first thin film transistors each of which comprising a silicon active layer, the array substrate comprising a base substrate; a silicon layer comprising a plurality of silicon active layers respectively for the plurality of first thin film transistors; and a UV absorption layer on a side of the silicon layer distal to the base substrate, and comprising a plurality of UV absorption blocks; wherein each of the plurality of UV absorption blocks is on a side of the one of the plurality of silicon active layers distal to the base substrate, and is insulated from the one of the plurality of silicon active layers.

Optionally, an orthographic projection of each of the plurality of UV absorption blocks on the base substrate substantially covers an orthographic projection of a channel part of the one of the plurality of silicon active layers on the base substrate.

Optionally, an orthographic projection of each of the plurality of UV absorption blocks on the base substrate substantially covers orthographic projections of a source contact part, a channel part, and a drain contact part of the one of the plurality of silicon active layers on the base substrate.

Optionally, an orthographic projection of each of the plurality of UV absorption blocks on the base substrate substantially covers an orthographic projection of the one of the plurality of silicon active layers on the base substrate.

Optionally, the UV absorption layer comprises a metal oxide material.

Optionally, the array substrate further comprises a plurality of second thin film transistors; each of the plurality of second thin film transistors comprises a metal oxide active layer; and the array substrate further comprises a metal oxide layer comprising a plurality of metal oxide active layers respectively for the plurality of second thin film transistors.

Optionally, the metal oxide layer and the UV absorption layer are in a same layer and made of a same metal oxide material.

Optionally, the array substrate further comprises a layer comprising an organic material on a side of the UV absorption layer distal to the base substrate.

Optionally, the layer comprising the organic material is one or a combination of a passivation layer, a pixel definition layer, and a spacer layer.

Optionally, the plurality of first thin film transistors are a plurality of bottom-gate type thin film transistors; and the array substrate further comprises a first gate electrode layer on the base substrate and comprising a plurality of first gate electrodes respectively for the plurality of first thin film transistors; and a first gate insulating layer on a side of the first gate electrode layer distal to the base substrate and on a side of the silicon layer proximal to the base substrate.

Optionally, the plurality of first thin film transistors are a plurality of top-gate type thin film transistors; and the array substrate further comprises a first gate electrode layer on the base substrate and, comprising a plurality of first gate electrodes respectively for the plurality of first thin film transistors; and a first gate insulating layer on a side of the first gate electrode layer proximal to the base substrate and on a side of the silicon layer distal to the base substrate.

Optionally, the plurality of second thin film transistors are a plurality of bottom-gate type thin film transistors; and the array substrate further comprises a second gate electrode layer on the base substrate and comprising a plurality of second gate electrode respectively for the plurality of second thin film transistors; and a second gate insulating layer on a side of the second gate electrode layer distal to the base substrate and on a side of the silicon layer proximal to the base substrate.

Optionally, the silicon layer is a polysilicon layer, and the plurality of silicon active layers are a plurality of polycrystalline silicon active layers.

Optionally, each of the metal oxide layer and the UV absorption layer comprises one or a combination of indium gallium zinc oxide, indium tin zinc oxide, indium zinc oxide, aluminum zinc oxide, and zinc oxide.

Optionally, the plurality of first thin film transistors are in a peripheral area, and the plurality of second thin film transistors are in a display area.

Optionally, the plurality of first thin film transistors are a plurality of switch thin film transistors each of which is connected to a data line and a gate electrode of one of the plurality of drive thin film transistors; and the plurality of second thin film transistors are a plurality of drive thin film transistors each of which is connected to a power supply line and an organic light emitting diode.

Optionally, the array substrate further comprises a display driver circuitry; wherein the display driver circuity comprises the plurality of first thin film transistors.

In another aspect, the present invention provides a display apparatus comprising the array substrate described herein or fabricated by a method described herein.

In another aspect, the present invention provides a method of fabricating an array substrate having a plurality of first thin film transistors each of which comprising a silicon active layer, the method comprising forming a silicon layer comprising forming a plurality of silicon active layers respectively for the plurality of first thin film transistors; and forming a UV absorption layer on a side of the silicon layer distal to the base substrate, and comprising forming a plurality of UV absorption blocks; wherein each of the plurality of UV absorption blocks is formed on a side of the one of the plurality of silicon active layers distal to the base substrate, and is insulated from the one of the plurality of silicon active layers.

Optionally, the UV absorption layer and the silicon layer are formed so that an orthographic projection of each of the plurality of IN absorption blocks on the base substrate substantially covers an orthographic projection of a channel part of the one of the plurality of silicon active layers on the base substrate.

Optionally, the array substrate further comprises a plurality of second thin film transistors; each of the plurality of second thin film transistors comprises a metal oxide active layer; and the method further comprises forming a metal oxide layer on a side of the silicon layer distal to the base substrate, and comprising forming a plurality of metal oxide active layers respectively for the plurality of second thin film transistors; wherein the metal oxide layer and the UV absorption layer are formed in a same layer in a same patterning process and made of a same metal oxide material.

Optionally, the method further comprises forming a layer comprising an organic material on a side of the UV absorption layer distal to the base substrate; wherein forming the layer comprising the organic material comprises exposing a photoresist layer using UV irradiation; and each of the plurality of UV absorption blocks shields the one of the plurality of silicon active layers from the UV irradiation during exposing the photoresist layer using the UV irradiation.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1A:
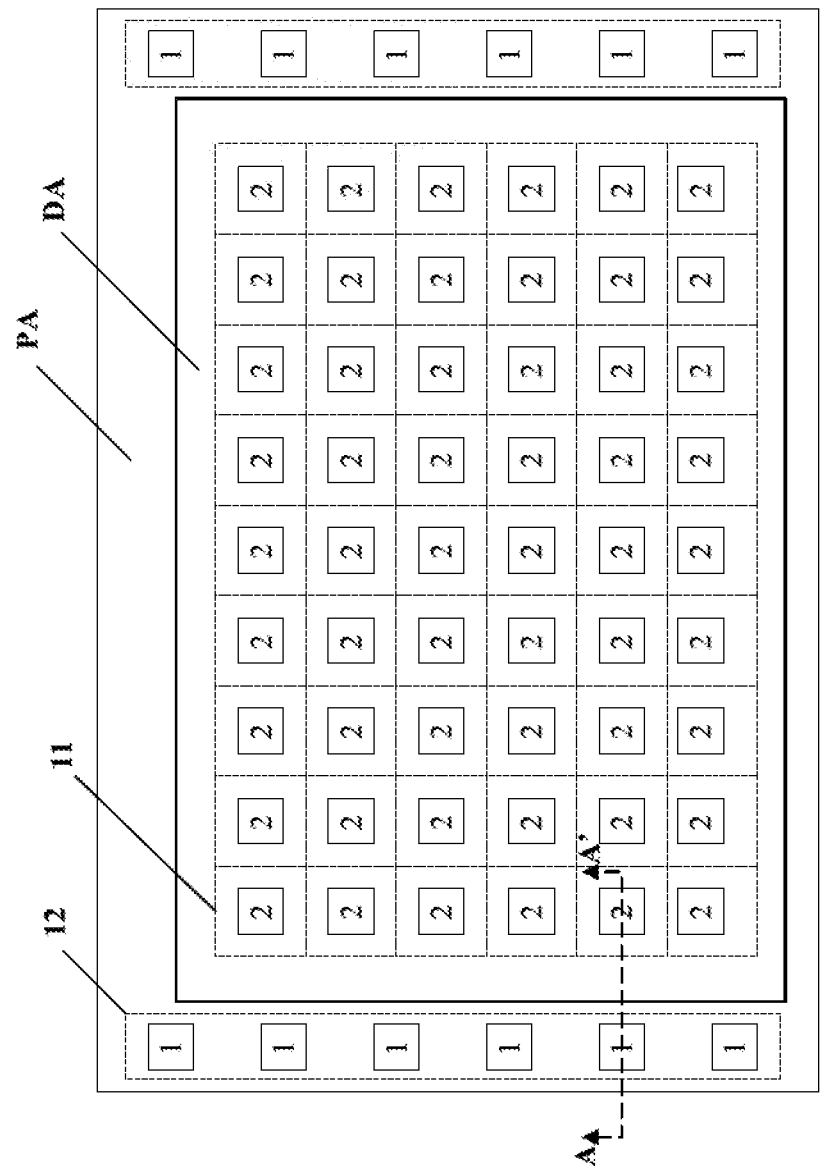
FIG. 1A is a schematic diagram illustrating the structure of an array substrate in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

During the fabrication process of the conventional array substrate, typically one or more layers containing an organic material is to be formed subsequent to the formation of the plurality of thin film transistors. In forming the one or more layer made of an organic material, typically a photoresist layer is formed during a lithography process. The photoresist layer is exposed by a UV light, and developed to form a certain photoresist pattern. When the thin film transistors include silicon active layers, the properties of the silicon active layers are often affected by the large dose of UV irradiation during the exposure, resulting in deterioration of the silicon active layers.

Accordingly, the present disclosure provides, inter alia, an array substrate, a display apparatus, and a method of fabricating an array substrate that substantially obviate one or more of the problems due to limitations and disadvantages of the related art. In one aspect, the present disclosure provides an array substrate having a plurality of first thin film transistors each of which including a silicon active layer and a plurality of second thin film transistors. In some embodiments, the array substrate includes a base substrate; a silicon layer having a plurality of silicon active layers respectively for the plurality of first thin film transistors; and a UV absorption layer on a side of the silicon layer distal to the base substrate, and including a plurality of UV absorption blocks, Optionally, each of the plurality of UV absorption layers is on a side of the one of the plurality of silicon active layers distal to the base substrate, and is insulated from the one of the plurality of silicon active layers. Optionally, the silicon active layer is a polycrystalline silicon active layer. Optionally, the silicon active layer is an amorphous silicon active layer. Optionally, the plurality of first thin film transistors are a plurality of bottom-gate type thin film transistors. Optionally, the plurality of second thin film transistors are plurality of bottom-gate type thin film transistors. Optionally, the plurality of first thin film transistors are a plurality of top-gate type thin film transistors. Optionally, the plurality of second thin film transistors are plurality of top-gate type thin film transistors. Optionally, each of the plurality of second thin film transistors includes a metal oxide active layer, the array substrate further includes a metal oxide layer having a plurality of metal oxide active layers respectively for the plurality of second thin film transistors.

The UV absorption layer is made of a UV absorption material and is configured to shield UV light from at least a portion of the one of the plurality of silicon active layers. During the fabrication process of the array substrate, one or more layers need to be formed subsequent to the formation of the plurality of silicon active layers. In particular, one or more layers made of an organic material are formed subsequent to the formation of the plurality of silicon active layers. In forming the one or more layers, typically a photoresist layer is tarried during a lithography process. The photoresist layer is exposed by a UV light, and developed to form a certain photoresist pattern. The UV light used in the lithography process can deteriorate the properties of the plurality of first thin film transistors. By having a UV absorption layer that blocks UV light from at least a portion of each of the plurality of silicon active layers, the properties of the plurality of first thin film transistors can be maintained stable during the fabrication process, resulting in an array substrate with enhanced performance.

Various appropriate UV absorption materials and various appropriate fabricating methods may be used for making the UV absorption layer. Examples of UV absorption materials include metal oxides such as indium gallium zinc oxide, indium tin zinc oxide, indium zinc oxide, aluminum zinc oxide, and zinc oxide. Other examples of UV absorption materials include a resin material having one or more UV absorbers dispersed therein, an organic material having one or more UV absorbers dispersed therein, a polymer material having one or more UV absorbers dispersed therein, and so on. Examples of UV absorbers include 2-hydroxy-4-n-octoxybenzophenone, 2-hydroxy-4-methoxybenzophenone, 2-(2'-hydroxy-5'-methylphenyl)benzotriazole, and other derivatives of 2-hydroxybenzophenone or benzotriazole, as well as 2,4-dihydroxybenzoylfuran, phenyl salicylate, resorcinol disalicylate, resorcinol monobenzoate and dibenzoate, benzyl benzoate, stilbene, and betamethylumbelliferone and its benzoate.

Optionally, the UV absorption layer is capable of blocking at least 50% (e.g., at least 60%, at least 70%, at least 80%, at least 90%, at least 95%, and at least 99%) of an incident UV light (wavelength range 10 nm to 400 nm).

FIG. 1A is a schematic diagram illustrating the structure of an array substrate in some embodiments according to the present disclosure. Referring to FIG. 1A, the array substrate in some embodiments includes a plurality of first thin, film transistors 1 and a plurality of second thin film transistors 2. Each of the plurality of first thin film transistors 1 is a thin film transistor having a polycrystalline silicon active layer. Each of the plurality of second thin film transistors 2 is a thin film transistor having a metal oxide active layer. Optionally, the array substrate is formed to have a display area DA and a peripheral area PA. Optionally, the plurality of first thin film transistors 1 are in the peripheral area PA, and the plurality of second thin film transistors 2 are in the display area DA. Optionally, the array substrate includes an array of a matrix of a plurality of subpixels 11, and each of the plurality of second thin film transistors 2 is in one of the plurality of subpixels 11, as shown in FIG. 1A. Optionally, the array substrate includes a display driver circuitry 12, and the display driver circuitry 12 includes the plurality of first thin film transistors 1. Optionally, the display driver circuitry 12 is a gate-on-array circuit for driving a plurality of gate lines in the array substrate. Optionally, the display driver circuitry 12 is a demultiplexer circuit. Optionally, the array substrate is a liquid crystal array substrate. Optionally, the array substrate is an organic light emitting diode array substrate. Optionally, the plurality of first thin film transistors 1 are a plurality of bottom-gate type thin film transistors. Optionally, the plurality of second thin film transistors 2 are plurality of bottom-gate type thin film transistors. Optionally, the plurality of first thin film transistors 1 are a plurality of top-gate type thin film transistors. Optionally, the plurality of second thin film transistors 2 are plurality of top-gate type thin film transistors.

As used herein the term "peripheral area" refers to an area where various circuits and wires are provided to transmit signals to the array substrate. To increase the transparency of the display apparatus, non-transparent or opaque components of the display apparatus (e.g., battery, printed circuit board, metal frame), can be disposed in the peripheral area rather than in the display areas. As used herein, the term "display area" refers to an area of the array substrate where image is actually displayed. Optionally, the display area may include both a subpixel region and an inter-subpixel region. A subpixel region refers to a light emission region of a subpixel, such as a region corresponding to a pixel electrode in a liquid crystal display or a region corresponding to a light emissive layer in an organic light emitting diode display. An inter-subpixel region refers to a region between adjacent subpixel regions, such as a region corresponding to a black matrix in a liquid crystal display or a region corresponding a pixel definition layer in an organic light emitting diode display. Optionally, the inter-subpixel region is a region between adjacent subpixel regions in a same pixel. Optionally, the inter-subpixel region is a region between two adjacent subpixel regions from two adjacent pixels.

Figure 1B:
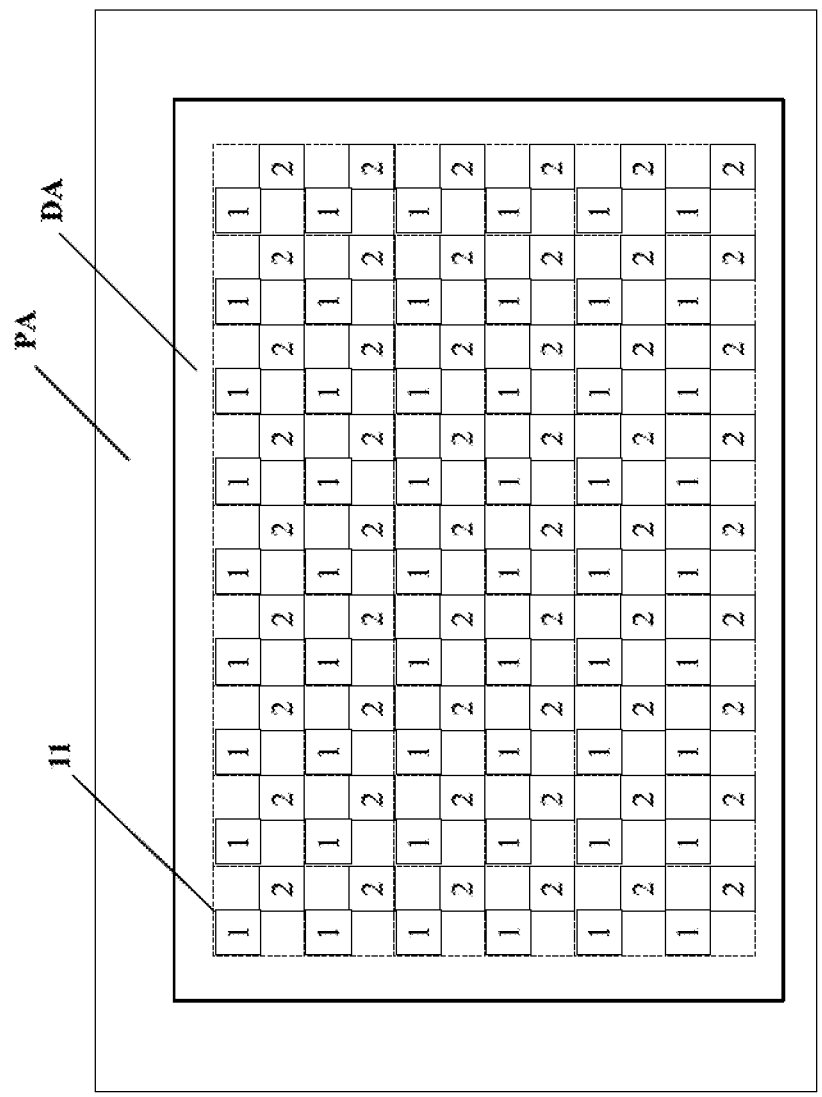
FIG. 1B is a schematic diagram illustrating the structure of an array substrate in some embodiments according to the present disclosure.

In some embodiments, the display area of the array substrate includes both a plurality of first thin film transistors 1 and a plurality of second thin film transistors 2. FIG. 1B is a schematic diagram illustrating the structure of an array substrate in some embodiments according to the present disclosure. Referring to FIG. 1B, the array substrate in some embodiments includes a plurality of first thin film transistors 1 and a plurality of second thin film transistors 2, both of which in the display area DA. Each of the plurality of first thin film transistors 1 is a thin film transistor having a polycrystalline silicon active layer. Each of the plurality of second thin film transistors 2 is a thin film transistor having a metal oxide active layer. In one example, the array substrate includes an array of a matrix of a plurality of subpixels 11, each of which includes at least one of the plurality of first bottom-gate type thin film transistors 1 and at least one of the plurality of second bottom-gate type thin film transistors 2. Optionally, the array substrate is an organic light emitting diode array substrate. Optionally, the plurality of first thin film transistors 1 are switch thin film transistors (e.g., transistors connected to data lines and the gate electrode of the drive transistors, i.e., address selection thin film transistors) in an organic light emitting diode array substrate. Optionally, the plurality of second thin film transistors 2 are drive thin film transistors (e.g., transistors connected to the power supply line and to the light emitting diode) in an organic light emitting diode array substrate. Optionally, the plurality of first thin film transistors 1 are a plurality of bottom-gate type thin film transistors. Optionally, the plurality of second thin film transistors 2 are plurality of bottom-gate type thin film transistors. Optionally, the plurality of first thin film transistors 1 are a plurality of top-gate type thin film transistors. Optionally, the plurality of second thin film transistors 2 are plurality of top-gate type thin film transistors.

Figure 1C:
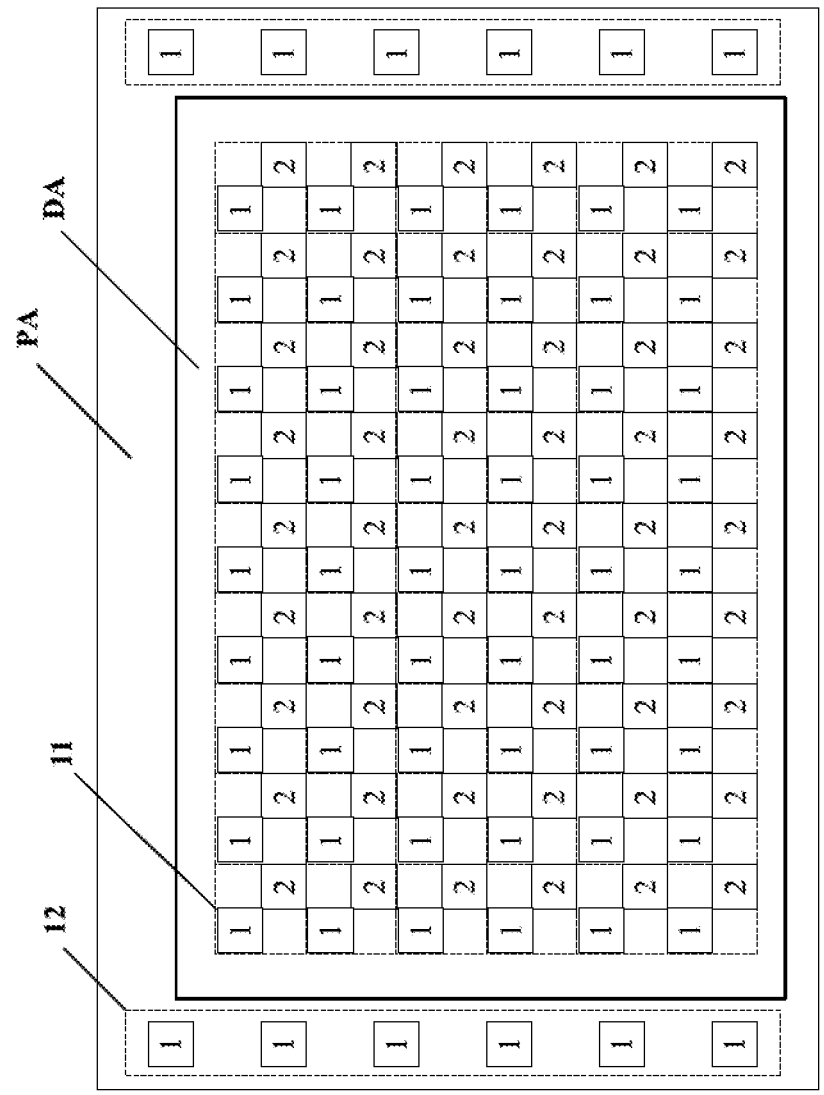
FIG. 1C is a schematic diagram illustrating the structure of an array substrate in some embodiments according to the present disclosure.

In some embodiments, the plurality of second thin film transistors 2 are in the display area DA, and the plurality of first thin film transistors 1 are in the display area DA and the peripheral area PA. FIG. 1C is a schematic diagram illustrating the structure of an array substrate in some embodiments according to the present disclosure. Referring to FIG. 1C, the array substrate in some embodiments includes a plurality of first thin film transistors 1 and a plurality of second thin film transistors 2. The peripheral area PA includes multiple first thin film transistors of the plurality of first thin film transistors 1. The display area DA includes the plurality of second thin film transistors 2 and multiple first thin film transistors of the plurality of first thin film transistors 1. In one example, array substrate is an organic light emitting diode array substrate. Optionally, the plurality of second thin film transistors 2 are drive thin film transistors (e.g., transistors connected to the power supply line and to the light emitting diode) in an organic light emitting diode array substrate. Optionally, the plurality of first thin film transistors 1 in the display area DA are switch thin film transistors (e.g., transistors connected to data lines and the gate electrode of the drive transistors, i.e., address selection thin film transistors) in an organic light emitting diode array substrate. Optionally, the plurality of first thin film transistors in the peripheral area PA are thin film transistors in the display driver circuitry 12, which is disposed in the peripheral area PA. Optionally, the plurality of first thin film transistors 1 are a plurality of bottom-gate type thin film transistors. Optionally, the plurality of second thin film transistors 2 are plurality of bottom-gate type thin film transistors. Optionally, the plurality of first thin film transistors 1 are a plurality of top-gate type thin film transistors. Optionally, the plurality of second thin film transistors 2 are plurality of top-gate type thin film transistors.

Figure 2:
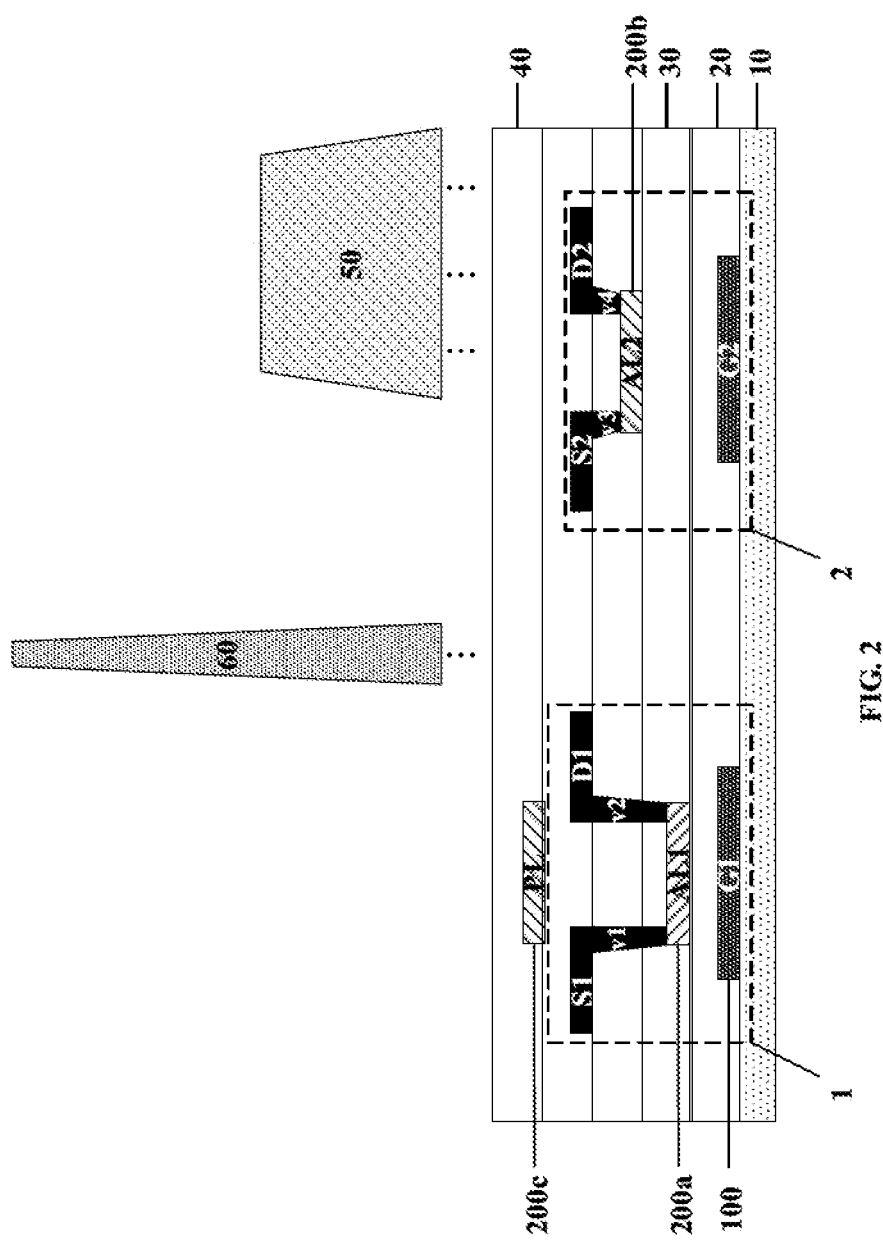
FIG. 2 is a cross-sectional view along line A-A' in the array substrate of FIG. 1A in some embodiments according to the present disclosure.

FIG. 2 is a cross-sectional view along line A-A' in the array substrate of FIG. Iowa in some embodiments according to the present disclosure. Referring to FIG. 2, one of the plurality of first thin film transistors 1 and one of the plurality of second thin film transistors 2 are shown in an array substrate. The array substrate includes a base substrate 10, a silicon layer 200a including a plurality of silicon active layers AL1 respectively for the plurality of first thin film transistors 1, a metal oxide layer 200b including a plurality of metal oxide active layers AL2 respectively for the plurality of second thin film transistors 2, a UV absorption layer 200c on a side of the silicon layer distal to the base substrate 10 and including a plurality of UV absorption blocks PL. Each of the plurality of UV absorption blocks PL is on a side of the one of the plurality of silicon active layers AL1 distal to the base substrate 10, and is insulated from the one of the plurality of silicon active layers AL1. Each of the plurality of UV absorption blocks PL is configured to block UV light from at least a portion of the one of the plurality of silicon active layers AL1.

In some embodiments, each of the plurality of UV absorption blocks PL is configured to block UV light from at least a portion of the one of the plurality of silicon active layers AL1, the portion being a conductive portion when the one of the plurality of first thin film transistors 1 is switched to an ON state. Optionally, an orthographic projection of each of the plurality of UV absorption blocks on the base substrate 10 substantially covers an orthographic projection of at least the conductive portion on the base substrate 10. As shown in FIG. 2, the array substrate includes at least a second insulating layer 30 between the UV absorption layer 200c and the silicon layer 200a, thereby insulating each of the plurality of UV absorption blocks PL from the one of the plurality of silicon active layer AL1.

Figure 3:
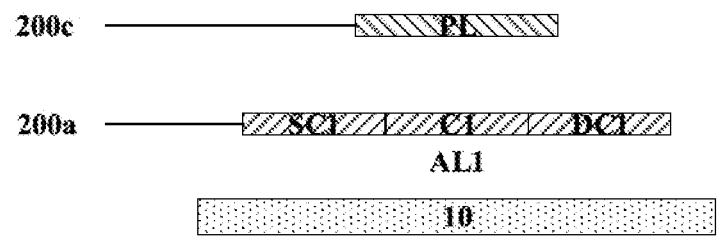
FIG. 3 is a schematic diagram illustrating the relationship between a UV absorption block and a silicon active layer in some embodiments according to the present disclosure.

FIG. 3 is a schematic diagram illustrating the relationship between a UV absorption block and a silicon active layer in some embodiments according to the present disclosure. Referring to FIG. 3, in some embodiments, an orthographic projection of each of the plurality of UV absorption blocks PL on the base substrate 10 substantially covers an orthographic projection of at least a channel part C1 of the one of the plurality of silicon active layers AL1 on the base substrate 10.

Figure 4:
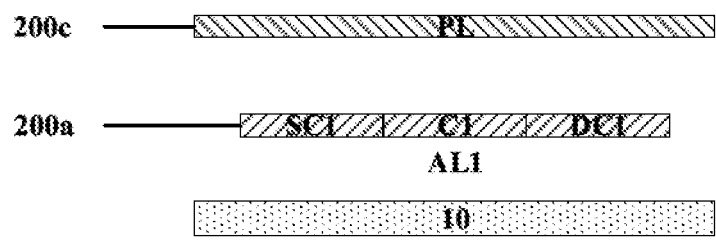
FIG. 4 is a schematic diagram illustrating the relationship between a UV absorption block and a silicon active layer in some embodiments according to the present disclosure.

FIG. 4 is a schematic diagram illustrating the relationship between a UV absorption block and a silicon active layer in some embodiments according to the present disclosure. Referring to FIG. 4, in some embodiments, an orthographic projection of each of the plurality of UV absorption blocks PL on the base substrate 10 substantially covers orthographic projections of a source contact part SC1, a channel part C1, and a drain contact part DC1 of the one of the plurality of silicon active layers AL1 on the base substrate 10.

In some embodiments, an orthographic projection of each of the plurality of UV absorption blocks PL on the base substrate 10 substantially covers an orthographic projection of the one of the plurality of silicon active layers AL1 on the base substrate 10. The plurality of UV absorption blocks PL are spaced apart from each other.

Referring to FIG. 2, in some embodiments, the plurality of first thin film transistors 1 are a plurality of bottom-gate type thin film transistors, and the plurality of second thin film transistors 2 are plurality of bottom-gate type thin film transistors. In some embodiments, the array substrate includes a base substrate 10, a gate electrode layer on the base substrate 10 and including a plurality of first gate electrodes G1 respectively for the plurality of first thin film transistors 1 and a plurality of second gate electrodes G2 respectively for the plurality of second thin film transistors 2, a first insulating layer 20 (e.g., a gate insulating layer) on a side of the gate electrode layer distal to the base substrate 10, a silicon layer 200a on a side of the first insulating layer 20 distal to the base substrate 10 and including a plurality of silicon active layers AL1 respectively for the plurality of first thin film transistors 1, a second insulating layer 30 on a side of the silicon layer 200a distal to the first insulating layer 20, a metal oxide layer 200b on a side of the second insulating layer 30 distal to the first insulating layer 20 and including a plurality of metal oxide active layers AL2 respectively for the plurality of second thin film transistors 2, and a UV absorption layer 200c on a side of the silicon layer 200a distal to the base substrate 10 and including a plurality of UV absorption blocks PL.

Optionally, the metal oxide layer 200b is on a side of the silicon layer 200a distal to the base substrate 10. Optionally, the metal oxide layer 200b and the silicon layer 200a are spaced apart by at least the second insulating layer 30.

Optionally, each of the plurality of first thin film transistors 1 further includes a source electrode S1 and a drain electrode D1. The source electrode S1 is electrically connected to the one of the plurality of silicon active layers AL1 through a first via V1 extending through at least the second insulating layer 30. The drain electrode D1 is electrically connected to the one of the plurality of silicon active layers AL1 through a second via V2 extending through at least the second insulating layer 30.

Optionally, each of the plurality of second thin film transistors 2 further includes a source electrode S2 and a drain electrode D2. The source electrode S2 is electrically connected to the one of the plurality of metal oxide active layers AL2 through a third via V3. The drain electrode D2 is electrically connected to the one of the plurality of metal oxide active layers AL2 through a fourth via V4.

Optionally, the UV absorption layer 200c is made of a metal oxide material. Optionally, the UV absorption layer 200c includes one or a combination of indium gallium zinc oxide, indium tin zinc oxide, indium zinc oxide, aluminum zinc oxide, and zinc oxide.

In some embodiments, the array substrate further includes one or more layers including an organic material. As shown in FIG. 2, the one or more layers include, for example, a passivation layer 40 on a side of the UV absorption layer 200c distal to the silicon layer 200a, a pixel definition layer 50 on a side of the passivation layer 40 distal to the base substrate 10, and a spacer layer 60 on a side of the passivation layer 40 distal to the base substrate 10. In forming these layers which include one or more organic materials, a photoresist layer is formed and exposed with a UV irradiation. By having one of the plurality of UV absorption blocks PL to block UV light from the corresponding one of the plurality of silicon active layers AL1, the properties of the plurality of silicon active layers AL1 will not be affected by the UV irradiation.

Figure 5:
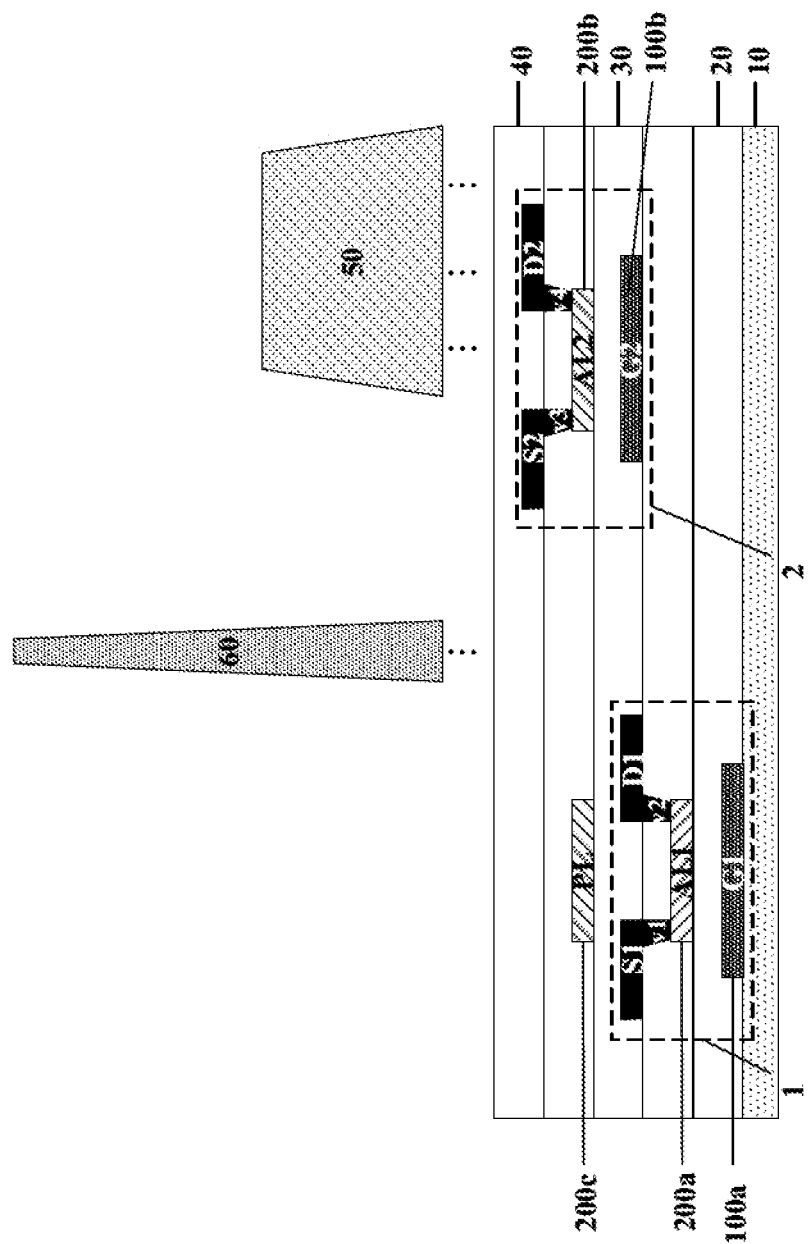
FIG. 5 is a cross-sectional view along line A-A' in the army substrate of FIG. 1A in some embodiments according to the present disclosure.

FIG. 5 is a cross-sectional view along line A-A' in the array substrate of FIG. 1A in some embodiments according to the present disclosure. Referring to FIG. 5, in some embodiments, the UV absorption layer 200c and the metal oxide layer 200b are disposed on a same horizontal plane, e.g., both the UV absorption layer 200c and the metal oxide layer 200b are disposed on a surface of the second insulating layer 30. Moreover, in some embodiments, the UV absorption layer 200c and the metal oxide layer 200b are in a same layer and made of a same metal oxide material and a same patterning process.

As used herein, the term "same layer" refers to the relationship between the layers simultaneously formed in the same step. In one example, the UV absorption layer 200c and the metal oxide layer 200b are in a same layer when they are formed as a result of one or more steps of a same patterning process performed in a same layer of material. In another example, the UV absorption layer 200c and the metal oxide layer 200b can be formed in a same layer by simultaneously performing the step of forming the UV absorption layer 200c and the step of forming the metal oxide layer 200b. The term "same layer" does not always mean that the thickness of the layer or the height of the layer in a cross-sectional view is the same.

Referring to FIG. 5, in some embodiments, the plurality of first thin film transistors 1 are a plurality of bottom-gate type thin film transistors, and the plurality of second thin film transistors 2 are plurality of bottom-gate type thin film transistors. In some embodiments, the array substrate in some embodiments include a base substrate 10, a first gate electrode layer 100a including a plurality of gate electrodes G1 respectively for the plurality of first thin film transistors 1 on the base substrate 10, a first insulating layer 20 (e.g., a first gate insulating layer) on a side of the first gate electrode layer 100a distal to the base substrate 10, a silicon layer 200a on a side of the first insulating layer 20 distal to the base substrate 10 and including a plurality of silicon active layers AL1 respectively for the plurality of first thin film transistors 1, a second gate electrode layer 100b on a side of the first insulating layer 20 distal to the base substrate 10 and including a plurality of second gate electrodes G2 respectively for the plurality of second thin film transistors 2, a second insulating layer 30 (e.g., a second gate insulating layer) on a side of the second gate electrode layer 100b distal to the base substrate 10, a metal oxide layer 200b on a side of the second insulating layer 30 distal to the first insulating layer 20 and including a plurality of metal oxide active layers AL2 respectively for the plurality of second thin film transistors 2, a UV absorption layer 200c in a same layer as the metal oxide layer 200b and including a plurality of UV absorption blocks PL. Optionally, both the UV absorption layer 200c and the metal oxide layer 200b are made of a same metal oxide material, formed in a same patterning process using a same mask plate. Metal oxide materials have excellent UV absorption ability (e.g., effectively blocking light having a wavelength less than 400 nm) while at the same time allows visible light to pass through.

Optionally, the metal oxide layer 200b and the UV absorption layer 200c are on a side of the silicon layer 200a distal to the base substrate 10. Optionally, the silicon layer 200a is spaced apart from the metal oxide layer 200b and the UV absorption layer 200c by at least the second insulating layer 30.

Optionally, each of the plurality of first thin film transistors 1 further includes a source electrode S1 and a drain electrode D1. The source electrode S1 is electrically connected to the one of the plurality of silicon active layers AL1 through a first via V1. The drain electrode D1 is electrically connected to the one of the plurality of silicon active layers AL1 through a second via V2.

Optionally, each of the plurality of second thin film transistors 2 further includes a source electrode S2 and a drain electrode D2. The source electrode S2 is electrically connected to the one of the plurality of metal oxide active layers AL2 through a third via V3. The drain electrode D2 is electrically connected to the one of the plurality of metal oxide active layers AL2 through a fourth via V4.

Optionally, the UV absorption layer 200c is made of a metal oxide material. Optionally, the UV absorption layer 200c includes one or a combination of indium gallium zinc oxide, indium tin zinc oxide, indium zinc oxide, aluminum zinc oxide, and zinc oxide.

In some embodiments, the array substrate further includes one or more layers including an organic material. As shown in FIG. 5, the one or more layers include, for example, a passivation layer 40 on a side of the UV absorption layer 200c distal to the silicon layer 200a, a pixel definition layer 50 on a side of the passivation layer 40 distal to the base substrate 10, and a spacer layer 60 on a side of the passivation layer 40 distal to the base substrate in forming these layers which include one or more organic materials, a photoresist layer is formed and exposed with a UV irradiation. By having one of the plurality of UV absorption blocks PL to block UV light from the corresponding one of the plurality of silicon active layers AL1, the properties of the plurality of silicon active layers AL1 will not be affected by the UV irradiation.

Optionally, the plurality of first thin film transistors 1 are a plurality of bottom-gate type thin film transistors. Optionally, the array substrate further includes a first gate electrode layer on the base substrate and including a plurality of first gate electrodes respectively for the plurality of first thin film transistors; and a first gate insulating layer on a side of the first gate electrode layer distal to the base substrate and on a side of the silicon layer proximal to the base substrate.

Optionally, the plurality of first thin film transistors 1 are a plurality of top-gate type thin film transistors. Optionally, the array substrate further includes a first gate electrode layer on the base substrate and including a plurality of first, gate electrodes respectively for the plurality of first thin film transistors; and a first gate insulating layer on a side of the first gate electrode layer proximal to the base substrate and on a side of the silicon layer distal to the base substrate.

Optionally, the plurality of second thin film transistors 2 are a plurality of bottom-gate type thin film transistors. Optionally, the array substrate further includes a second gate electrode layer on the base substrate and including a plurality of second gate electrode respectively for the plurality of second thin film transistors; and a second gate insulating layer on a side of the second gate electrode layer distal to the base substrate and on a side of the silicon layer proximal to the base substrate.

Optionally, the plurality of second thin film transistors 2 are a plurality of top-gate type thin film transistors. Optionally, the array substrate further includes a second gate electrode layer on the base substrate and including a plurality of second gate electrode respectively for the plurality of second thin film transistors; and a second gate insulating layer on a side of the second gate electrode layer proximal to the base substrate and on a side of the silicon layer proximal to the base substrate.

Optionally, the silicon layer is a polysilicon layer, and the plurality of silicon active layers are a plurality of polycrystalline silicon active layers.

Optionally, each of the metal oxide layer and the UV absorption layer includes one or a combination of indium gallium zinc oxide, indium tin zinc oxide, indium zinc oxide, aluminum zinc oxide, and zinc oxide.

Optionally, the plurality of first thin film transistors 1 are in a peripheral area, and the plurality of second thin film transistors 2 are in a display area.

Optionally, the plurality of first thin film transistors 1 are a plurality of switch thin film transistors each of which is connected to a data line and a gate electrode of one of the plurality of drive thin film transistors; and the plurality of second thin film transistors 2 are a plurality of drive thin film transistors each of which is connected to a power supply line and an organic light emitting diode.

Optionally, the array substrate further includes a display driver circuitry, and the display driver circuity includes the plurality of first thin film transistors 1.

In another aspect, the present disclosure further provides a method of fabricating an array substrate having a plurality of first thin film transistors each of which having a silicon active layer and a plurality of second thin film transistors. In some embodiments, the method includes forming a silicon layer including forming a plurality of silicon active layers respectively for the plurality of first thin film transistors; and forming a UV absorption layer on a side of the silicon layer distal to the base substrate, and including forming a plurality of UV absorption blocks. Optionally, each of the plurality of UV absorption blocks is formed on a side of the one of the plurality of silicon active layers distal to the base substrate, and is insulated from the one of the plurality of silicon active layers. Optionally, each of the plurality of second thin film transistors includes a metal oxide active layer, and the method further includes forming a metal oxide layer on a side of the silicon layer distal to the base substrate, Optionally, the step of forming the metal oxide layer includes forming a plurality of metal oxide active layers respectively for the plurality of second thin film transistors.

Optionally, the UV absorption layer and the silicon layer are formed so that an orthographic projection of each of the plurality of UV absorption blocks on the base substrate substantially covers an orthographic projection of a channel part of the one of the plurality of silicon active layers on the base substrate. Optionally, the UV absorption layer and the silicon layer are formed so that an orthographic projection of each of the plurality of UV absorption blocks on the base substrate substantially covers orthographic projections of a source contact part, a channel part, and a drain contact part of the one of the plurality of silicon active layers on the base substrate. Optionally, the UV absorption layer and the silicon layer are formed so that an orthographic projection of each of the plurality of UV absorption blocks on the base substrate substantially covers an orthographic projection of the one of the plurality of silicon active layers on the base substrate.

Optionally, the UV absorption layer is formed using a metal oxide material.

Optionally, the metal oxide layer is formed on a side of the silicon layer distal to the base substrate. Optionally, the metal oxide layer and the silicon layer are formed to be spaced apart by at least an insulating layer.

In some embodiments, the metal oxide layer and the UV absorption layer are formed in a same layer in a same patterning process and made of a same metal oxide material.

In some embodiments, the method further includes forming a layer including an organic material on a side of the UV absorption layer distal to the base substrate. Optionally, forming the layer including the organic material includes exposing a photoresist layer using UV irradiation. Optionally, each of the plurality of UV absorption blocks shields the one of the plurality of silicon active layers from the UV irradiation during exposing the photoresist layer using the UV irradiation.

Figure 6:
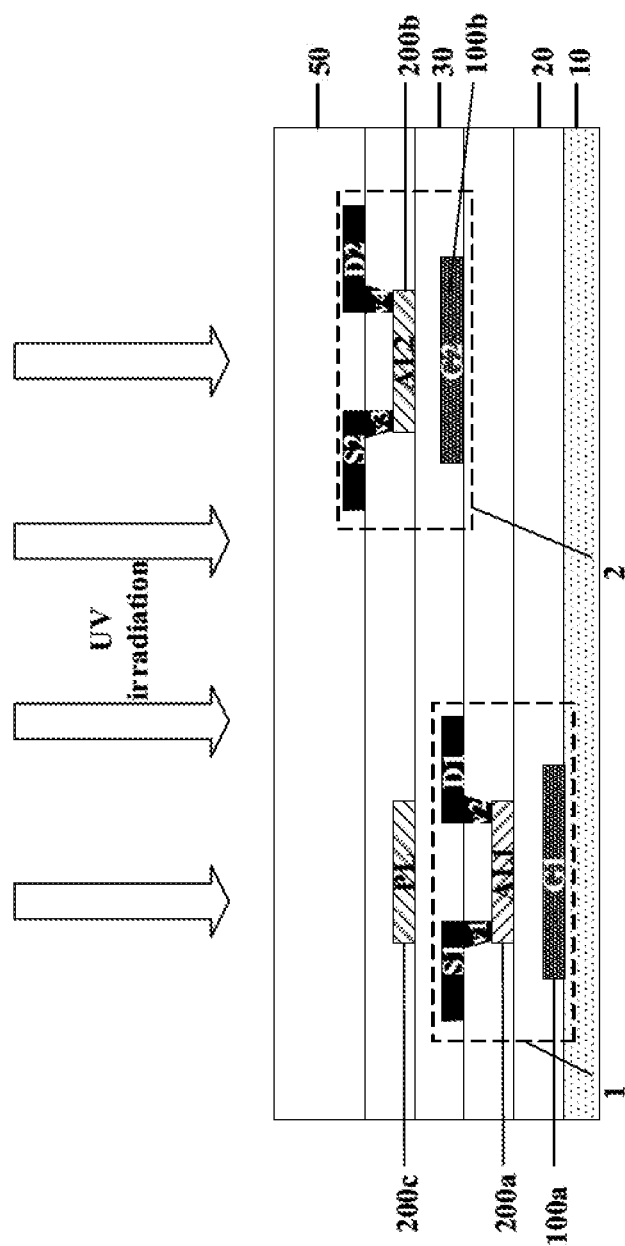
FIG. 6 illustrates a process of forming a layer using a photoresist layer during the fabrication process of an array substrate in some embodiments according to the present disclosure.

FIG. 6 illustrates a process of forming a layer using a photoresist layer during the fabrication process of an array substrate in some embodiments according to the present disclosure. Referring to FIG. 6, a photoresist layer 50 is formed on a side of the plurality of first thin film transistors 1 and the plurality of second thin film transistors 2 distal to the base substrate 10. The photoresist layer 50 is exposed using UV irradiation to form a photoresist pattern. As shown in FIG. 6, each of the plurality of UV absorption blocks PL shields the one of the plurality of silicon active layers AL1 from the UV irradiation during exposing the photoresist layer 50 using the UV irradiation. Optionally, the photoresist layer 50 is used for forming a layer made of an organic material, e.g., a passivation layer, a pixel definition layer, and a spacer layer.

In another aspect, the present disclosure further provides a display panel having the array substrate described herein or fabricated by a method described herein.

In another aspect, the present disclosure further provides a display apparatus having the array substrate described herein or fabricated by a method described herein. Optionally, the display apparatus is a liquid crystal display apparatus. Optionally, the display apparatus is an organic light emitting diode display apparatus. Optionally, the display apparatus is an electrophoretic display apparatus. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, having a plurality of first thin film transistors and a plurality of second thin film transistors, the array substrate comprising:
   a base substrate;
   a first gate electrode layer on the base substrate and comprising a plurality of first gate electrodes respectively for the plurality of first thin film transistors;
   a first gate insulating layer on a side of the first gate electrode layer distal to the base substrate and on a side of the silicon layer proximal to the base substrate;
   a silicon layer comprising a plurality of silicon active layers respectively for the plurality of first thin film transistors on the first insulating layer;
   a metallic conductive layer on a side of the silicon layer away from the base substrate; and
   a metal oxide layer on a side of the metallic conductive layer away from the silicon layer;
   wherein the metallic conductive layer comprises gate electrodes of the plurality of second thin film transistors, source electrodes and drain electrodes of the plurality of first thin film transistors;
   the plurality of silicon active layers are in direct contact with the first gate insulating layer;
   the gate electrodes of the plurality of second thin film transistors and the source electrodes and drain electrodes of the plurality of first thin film transistors are spaced apart from the first gate insulating layer;
   the metal oxide layer comprises a plurality of first metal oxide blocks that are floating and a plurality of second metal oxide blocks;
   the plurality of second metal oxide blocks are a plurality of metal oxide active layers respectively for the plurality of second thin film transistors;
   the plurality of first metal oxide blocks and the plurality of second metal oxide blocks are in a same layer;
   an orthographic projection of a respective one of the plurality of first metal oxide blocks on the base substrate at least partially overlaps with an orthographic projection of a respective one of the plurality of silicon active layers on the base substrate; and
   an orthographic projection of a respective one of the plurality of second metal oxide blocks on the base substrate at least partially overlaps with an orthographic projection of a respective one of the gate electrodes of the plurality of second thin film transistors on the base substrate.

2. The array substrate of claim 1, wherein the orthographic projection of a respective one of the plurality of first metal oxide blocks on the base substrate substantially covers an orthographic projection of a channel part of the respective one of the plurality of silicon active layers on the base substrate.

3. The array substrate of claim 1, wherein the orthographic projection of a respective one of the plurality of first metal oxide blocks on the base substrate completely covers orthographic projections of a source contact part, a channel part, and a drain contact part of the respective one of the plurality of silicon active layers on the base substrate, the source contact part, the drain contact part, and the channel part are made of a silicon material and are in a same layer.

4. The array substrate of claim 1, wherein the orthographic projection of a respective one of the plurality of first metal oxide blocks on the base substrate at least partially overlaps with an orthographic projection of a respective one of gate electrodes of the plurality of first thin film transistors on the base substrate; and
   the respective one of gate electrodes of the plurality of first thin film transistors is in a different layer from the respective one of the plurality of first metal oxide blocks.

5. The array substrate of claim 1, further comprising an insulating layer on a side of the plurality of silicon active layers away from the first gate insulating layer;
   wherein the source electrodes and drain electrodes of the plurality of first thin film transistors, and the gate electrodes of the plurality of second thin film transistors are on a side of the insulating layer away from the plurality of silicon active layers;
   wherein a respective source electrode is electrically connected to, and in direct contact with, a respective silicon active layer through a first via extending through the insulating layer;
   a respective drain electrode is electrically connected to, and in direct contact with, the respective silicon active layer through a second via extending through the insulating layer;
   the orthographic projection of a respective one of the plurality of first metal oxide blocks on the base substrate at least partially overlaps with orthographic projections of the first via and the second via on the base substrate.

6. The array substrate of claim 1, further comprising a layer comprising an organic material on a side of the metal oxide layer away from the base substrate.

7. The array substrate of claim 6, wherein the layer comprising the organic material is one or a combination of a passivation layer, a pixel definition layer, and a spacer layer.

8. The array substrate of claim 1, further comprising:
   a second gate insulating layer on a side of the gate electrodes of the plurality of second thin film transistors and the source electrodes and drain electrodes of the plurality of first thin film transistors away from the plurality of silicon active layers;
   wherein the gate electrodes of the plurality of second thin film transistors and the source electrodes and drain electrodes of the plurality of first thin film transistors are in direct contact with the second gate insulating layer; and
   the plurality of silicon active layers are spaced apart from the second gate insulating layer.

9. The array substrate of claim 1, wherein the silicon layer is a polysilicon layer, and the plurality of silicon active layers are a plurality of polycrystalline silicon active layers.

10. The array substrate of claim 1, wherein the metal oxide layer comprises one or a combination of indium gallium zinc oxide, indium tin zinc oxide, indium zinc oxide, aluminum zinc oxide, and zinc oxide.

11. The array substrate of claim 1, wherein the plurality of first thin film transistors are in a peripheral area, and the plurality of second thin film transistors are in a display area.

12. The array substrate of claim 1, comprising a pixel driving circuit for driving light emission of a light emitting diode; wherein the pixel driving circuit comprises a respective one of the plurality of first thin film transistors, the respective one of the plurality of first thin film transistors being connected to a data line and a gate electrode of one of the plurality of drive thin film transistors; and a respective one of the plurality of second thin film transistors, the respective one of the plurality of second thin film transistors being connected to a power supply line and the light emitting diode.

13. The array substrate of claim 1, further comprising a display driver circuitry;
wherein the display driver circuitry comprises the plurality of first thin film transistors.

14. A display apparatus, comprising the array substrate of claim 1, and a printed circuit board connected to the array substrate.

15. A method of fabricating an array substrate having a plurality of first thin film transistors and a plurality of second thin film transistors, comprising:
forming a first gate electrode layer on the base substrate and comprising a plurality of first gate electrodes respectively for the plurality of first thin film transistors;
forming a first gate insulating layer on a side of the first gate electrode layer distal to the base substrate and on a side of the silicon layer proximal to the base substrate;
forming a silicon layer comprising forming a plurality of silicon active layers respectively for the plurality of first thin film transistors on the first insulating layer;
forming a metallic conductive layer on a side of the silicon layer away from the base substrate; and
forming a metal oxide layer on a side of the metallic conductive layer away from the silicon layer;
wherein the metallic conductive layer comprises gate electrodes of the plurality of second thin film transistors, source electrodes and drain electrodes of the plurality of first thin film transistors;
the plurality of silicon active layers are in direct contact with the first gate insulating layer;
the gate electrodes of the plurality of second thin film transistors and the source electrodes and drain electrodes of the plurality of first thin film transistors are spaced apart from the first gate insulating layer;
forming the metal oxide layer comprises forming a plurality of first metal oxide blocks that are floating and a plurality of second metal oxide blocks;
the plurality of second metal oxide blocks are a plurality of metal oxide active layers respectively for the plurality of second thin film transistors;
the plurality of first metal oxide blocks and the plurality of second metal oxide blocks are in a same layer;
an orthographic projection of a respective one of the plurality of first metal oxide blocks on the base substrate at least partially overlaps with an orthographic projection of a respective one of the plurality of silicon active layers on the base substrate; and
an orthographic projection of a respective one of the plurality of second metal oxide blocks on the base substrate at least partially overlaps with an orthographic projection of a respective one of the gate electrodes of the plurality of second thin film transistors on the base substrate.

16. The method of claim 15, wherein the orthographic projection of a respective one of the plurality of first metal oxide blocks on the base substrate substantially covers an orthographic projection of a channel part of the respective one of the plurality of silicon active layers on the base substrate.

17. The method of claim 15, wherein the plurality of second metal oxide blocks are a plurality of metal oxide active layers respectively for the plurality of second thin film transistors.

18. The method of claim 15, further comprising forming a layer comprising an organic material on a side of the metal oxide layer away from the base substrate;
wherein forming the layer comprising the organic material comprises exposing a photoresist layer using UV irradiation; and
each of the plurality of UV absorption blocks shields the one of the plurality of silicon active layers from the UV irradiation during exposing the photoresist layer using the UV irradiation.

* * * * *